US011905620B2

(12) United States Patent
Liu et al.

(10) Patent No.: US 11,905,620 B2
(45) Date of Patent: Feb. 20, 2024

(54) PREPARATION AND APPLICATION OF HIGHLY COHERENT DIAMOND NITROGEN VACANCY AND DIAMOND ANVIL

(71) Applicant: Qufu Normal University, Qufu (CN)

(72) Inventors: Xiaobing Liu, Qufu (CN); Xiaoran Zhang, Qufu (CN)

(73) Assignee: QUFU NORMAL UNIVERSITY, Qufu (CN)

( * ) Notice: Subject to any disclaimer, the term of this patent is extended or adjusted under 35 U.S.C. 154(b) by 0 days.

(21) Appl. No.: 18/321,823

(22) Filed: May 23, 2023

(65) Prior Publication Data
US 2023/0383437 A1    Nov. 30, 2023

(30) Foreign Application Priority Data
May 26, 2022 (CN) .......................... 202210580229.1

(51) Int. Cl.
C30B 29/04    (2006.01)
C30B 1/12     (2006.01)
(Continued)

(52) U.S. Cl.
CPC ................ *C30B 29/04* (2013.01); *C30B 1/12* (2013.01); *C30B 33/02* (2013.01); *G01R 33/305* (2013.01)

(58) Field of Classification Search
CPC .......... C30B 33/02; C30B 29/04; C30B 1/12; G01R 33/305; C01B 32/25
See application file for complete search history.

(56) References Cited

U.S. PATENT DOCUMENTS 7,128,974 B2 * 10/2006 Scarsbrook ............. C30B 25/20
117/97
7,820,131 B2 * 10/2010 Hemley ................ C30B 25/105
117/88
(Continued)

FOREIGN PATENT DOCUMENTS

CN        110975760 A     4/2020
EP        2008007336    * 1/2008

OTHER PUBLICATIONS

CNIPA, Notification of a First Office Action for CN202210580229.1, dated Jun. 1, 2023.
(Continued)

*Primary Examiner* — Robert M Kunemund
(74) *Attorney, Agent, or Firm* — Zhigang Ma

(57) ABSTRACT

Preparations of a highly coherent diamond nitrogen vacancy (NV⁻) and a diamond anvil are provided. A graphite is used as a carbon source, a diamond is used as a crystal seed, aluminum/titanium is used as a nitrogen remover, and a single crystal diamond is synthesized under a high temperature and a high pressure, and high-pressure-high-temperature (HPHT) annealing is performed on the synthesized diamond; after the annealing, multiple NV⁻s are generated in <100> and <311> crystal orientation growth regions from scratch, while native NV⁻s in a <111> crystal orientation growth region are disappeared; and the <100> and <311> crystal orientation growth regions do not contain defects related to ferromagnetic elements. The high-density and highly coherent NV⁻s are produced under nondestructive conditions, and the diamond anvil with controlled NV⁻ depths are prepared to achieve a precise detection of the NV⁻ at a pressure above 60 GPa.

4 Claims, 5 Drawing Sheets

(51) Int. Cl.
    *C30B 33/02*     (2006.01)
    *G01R 33/30*     (2006.01)

(56) References Cited

U.S. PATENT DOCUMENTS 9,422,720 B2 *   8/2016   Shevlin ................... E04D 5/149
2006/0065187 A1 *  3/2006   Hemley ................ C23C 16/274
                                                    117/104
2017/0292069 A1 * 10/2017   Hemmer ................. C30B 29/04

OTHER PUBLICATIONS

Qufu Normal University (Applicant), Reply to Notification of a First Office Action for CN202210580229.1, w/replacement claims, dated Aug. 17, 2023.
Qufu Normal University (Applicant), Supplemental Reply to Notification of a First Office Action for CN202210580229.1, w/ (allowed)replacement claims, dated Sep. 5, 2023.
CNIPA, Notification to grant patent right for invention in CN202210580229.1, dated Sep. 13, 2023.

\* cited by examiner

PREPARATION AND APPLICATION OF HIGHLY COHERENT DIAMOND NITROGEN VACANCY AND DIAMOND ANVIL

FIELD OF THE DISCLOSURE

The disclosure relates to the field of quantum technology and precision testing materials, and more particularly to the preparation and application of a highly coherent diamond nitrogen vacancy and diamond anvil.

BACKGROUND OF THE DISCLOSURE

A nitrogen vacancy ($NV^-$) is an atomic-level defect inside a diamond, including a substituted nitrogen atom and a neighboring nitrogen vacancy, and is very sensitive to external fields (i.e., electric, magnetic, and temperature fields). Extreme conditions such as extremely low temperature, high-pressure and a strong magnetic field are important ways to discover and modulate novel states. To enable sensitive physical property measurements under the extreme conditions, advanced sensing detection schemes need to be developed. Spin quantum sensing based on diamond nitrogen vacancy centers can achieve sensitive measurements of physical parameters such as magnetism, electricity, mechanics, and thermodynamics, and has a spatial resolution at a micro-nano scale and an extremely wide working interval, it is expected to be an important tool for the sensitive physical property measurements under the extreme conditions. In order to realize the external field testing of the nitrogen vacancies under very high-pressure conditions, a commonly used method is to prepare the nitrogen vacancies by ion implantation or electron irradiation on an anvil surface of a diamond anvil cell (DAC). The sensitivity of the nitrogen vacancies depends mainly on their density and coherence time. Generally, the higher the density and the longer the coherence time, the higher the sensitivity. Both the ion implantation and the electron irradiation use high-energy ion or electron beams to bombard the surface of the diamond, causing carbon atoms to be forcibly replaced. The higher implantation energy, the higher implantation concentrations of the nitrogen atoms and the vacancies and the deeper depth. But the higher the implantation energy, the more damage to diamond lattice, even graphitization. In order to avoid the graphitization of the anvil surface, there is an upper limit to the implantation energy. Therefore, the density of the nitrogen vacancies prepared by this method is low and the depth is shallow. During the pressing process of the DAC, the pressure is concentrated on the anvil surface, and when the pressure exceeds about 60 gigapascal (GPa), a probe laser can no longer excite the shallow nitrogen vacancies, so the nitrogen vacancies can no longer be sensed. While, the ion implantation and irradiation bring serious damage to the lattice structure of diamond. It severely reduces mechanical properties of the diamond anvil and reduces the fracture pressure of the DAC.

SUMMARY OF THE DISCLOSURE

In response to a problem that a high-pressure precision detection cannot be used above 60 gigapascal (GPa), the disclosure provides a nondestructive and low-cost formation method for preparing high-quality of nitrogen vacancies. The formation method uses a graphite as a carbon source and a high-pressure-high-temperature (HPHT) diamond as a crystal seed, takes aluminum/titanium (Al/Ti) as a nitrogen remover, synthesizes a single crystal diamond under a high temperature and a high pressure. A volume ratio of a <100> crystal orientation growth region (i.e., growth region of <100> crystal orientation) and a <111> crystal orientation growth region (i.e., growth region of <111> crystal orientation) of the single crystal diamond can be regulated by selections of the crystal seed and a growth temperature. The single crystal diamond is HPHT annealed, and after the annealing, nitrogen vacancies are generated from scratch in the <100> crystal orientation growth region and <311> crystal orientation growth region (i.e., growth region of <311> crystal orientation), while native nitrogen vacancies in the <111> crystal orientation growth region are disappeared, eventually leading to a presence of the nitrogen vacancies in the <100> and <311> crystal orientation growth regions of the single crystal diamond; and the <100> and <311> crystal orientation growth regions do not contain defects related to ferromagnetic elements; thus high-density and highly coherent nitrogen vacancies are produced under the nondestructive conditions, and a diamond anvil with controlled nitrogen vacancy depths are prepared, thereby to achieve a precise detection of the nitrogen vacancies at the pressure above 60 GPa.

A highly coherent diamond nitrogen vacancy formation method uses an iron-nickel catalyst system, and takes a graphite as a carbon source, a HPHT diamond as a crystal seed, and Al/Ti as a nitrogen remover, synthesizes a single crystal diamond with a nitrogen content of 1~400 parts per million (ppm) under a high temperature and a high pressure, and a volume ratio of a <100> crystal orientation growth region and a <111> crystal orientation growth region of the single crystal diamond can be regulated by selections of the crystal seed and a growth temperature. The synthesized diamond is HPHT annealed under conditions with an annealing pressure of 4.5~6.5 GPa and an annealing temperature of 1400~1800 centigrade (° C.); and after annealing, multiple nitrogen vacancies are generated in the <100> crystal orientation growth region from scratch, while native nitrogen vacancies in the <111> crystal orientation growth region are disappeared, eventually leading to a presence of the nitrogen vacancies in the <100> crystal orientation growth region of the diamond. When the single crystal diamond has the <311> crystal orientation growth region, the nitrogen vacancies present in the <311> crystal orientation growth region of diamond at the same time; meanwhile, the <100> and <311> crystal orientation growth regions do not contain defects related to the ferromagnetic elements.

In an embodiment, the graphite is a graphite with a purity equal to or greater than 99.9%; the high pressure for synthesizing the single crystal diamond with nitrogen content of 1~400 ppm is in a range of 5.0 GPa to 6.5 GPa, and the high temperature is in a range of 1350° C. to 1850° C., and a time for keeping the temperature is in a range of 10 h to 60 h.

A method for preparing the highly coherent diamond anvil, using the highly coherent diamond nitrogen vacancy, includes three steps.

(1) Using an iron-nickel catalyst system, taking a high-purity graphite as a carbon source, and taking Al/Ti as a nitrogen remover, synthesizing a single crystal diamond with a nitrogen content in a range of 1 ppm to 400 ppm by keeping a temperature of 1350~1850° C. for 10~60 h at a pressure of 5.0~6.5 GPa; and a volume ratio of a <100> crystal orientation growth region and a <111> crystal orientation growth region of the single crystal diamond is regulated by selections of a crystal seed and a growth temperature.

(2) Performing annealing at an annealing pressure in a range of 4.5 GPa to 6.5 GPa, an annealing temperature in a range of 1400° C. to 1800° C., and an annealing time in a range of 1 h to 20 h; after the annealing, multiple nitrogen vacancies are generated from scratch in the <100> crystal orientation growth region, while native nitrogen vacancies in the <111> crystal orientation growth region are disappeared, eventually leading to the presence of the nitrogen vacancies in the <100> crystal orientation growth region of the diamond; when the single crystal diamond has the <311> crystal orientation growth region, the nitrogen vacancies present in the <311> crystal orientation growth region of diamond at the same time; and the <100> and <311> crystal orientation growth regions do not contain defects related to the ferromagnetic elements.

(3) Performing cutting on the single crystal diamond by placing an anvil surface inside one of the <100> and <311> crystal orientation growth regions, and placing a main body of the diamond anvil in the <111> crystal orientation growth region according to nitrogen vacancy depth requirements.

In an embodiment, orders of the annealing and the cutting of the diamond anvil can be exchanged.

In an embodiment, in the highly coherent diamond anvil prepared by the above method for preparing the highly coherent diamond anvil, a ratio of a depth of the nitrogen vacancies to a height of the diamond anvil is greater than 0 and less than 1.

Application of the highly coherent diamond anvil prepared by the above method for preparing the highly coherent diamond anvil in high voltage quantum sensors.

After the annealing at the range of 1400° C. to 1800° C., the multiple nitrogen vacancies are generated in the <100> and <311> crystal orientation growth regions from scratch, while the native nitrogen vacancies in the <111> crystal orientation growth region are disappeared, eventually leading to the presence of the nitrogen vacancies in the <100> and <311> crystal orientation growth regions of the diamond; and the <100> and <311> crystal orientation growth regions do not contain defects associated with ferromagnetic elements such as iron, nickel, etc. The peak width at half-height (FWHM) of fluorescence spectra of the nitrogen vacancies in the <100> and <311> crystal orientation growth regions of the annealed diamond is comparable to the FWHM of a low-nitrogen type IIa diamond; a grown diamond contains the <100> crystal orientation growth region through the selection of crystal species of the <100> crystal orientation growth region or the <111> crystal orientation growth region and the control of the growth temperature; and the cutting on the single crystal diamond can be any of available ways.

The disclosure has five beneficial effects as following.

(1) In the related art, the thickness of the nitrogen vacancies is usually around several tens of nm, and the thickness of the nitrogen vacancies is not controllable. However, the thickness of the nitrogen vacancies in the diamond anvil of the disclosure is controllable and the thickness of the nitrogen vacancies of the disclosure can be cut according to usage requirements.

(2) Mechanical properties of the diamond anvil are high. The disclosure is a nondestructive preparation of the nitrogen vacancies, and the anvil surface will not be damaged, so the intrinsic mechanical properties of diamond are maintained.

(3) The nitrogen vacancies in the diamond anvil have high sensitivity. The smaller energy for implantation is usually used in the related art in order to avoid serious damages to the anvil surface, resulting in a low density of the generated nitrogen vacancies and a short coherent time, and the nitrogen vacancies have low sensitivity. The density of the nitrogen vacancies prepared by the disclosure is high and the coherence time is long, so the sensitivity of the nitrogen vacancies is significantly higher than the sensitivity of the related art.

(4) Preparation costs are low. The related art requires a use of an advanced research equipment such as a transmission electron microscope (TEM) and a focused ion beam (FIB), but the disclosure uses a mature diamond growth equipment, so the preparation costs are greatly reduced.

(5) There are no nickel-related defects in regions where the nitrogen vacancies present.

DETAILED DESCRIPTION OF EMBODIMENTS

Embodiment 1

A method for preparing a highly coherent diamond anvil includes following steps.

(1) A Synthesis of a Diamond Containing High Quality Nitrogen Vacancies.

An iron-nickel catalyst system is used, a high-purity flaky graphite is used as a carbon source, and aluminum/titanium (Al/Ti) is used as a nitrogen remover, a <100> crystallographic plane of the diamond is used as a crystal seed, and a single crystal diamond is synthesized at 5.5 gigapascal (GPa) and 1460 centigrade (° C.) for 60 hours (h). The synthesized single crystal diamond has a nitrogen content of 20~80 ppm in a <100> crystal orientation growth region, and a nitrogen content of 200~300 ppm in a <111> crystal orientation growth region.

(2) Annealing

The HPHT annealing is performed on the single crystal diamond at an annealing pressure of 5 GPa and respective annealing temperatures of 1400° C., 1500° C., 1600° C. and 1700° C. for 4 h. There is no nitrogen vacancy on the <111> crystal orientation growth region of the single crystal diamond, and a content of nitrogen vacancies in the <311> and <100> crystal orientation growth regions is up to 10000/cubic micrometer (/μm³), and the coherence time is about 52 microseconds (μs).

(3) Cutting of Diamond Anvil

The cutting is performed on the single crystal diamond by placing an anvil surface in the <311> crystal orientation growth region and another main body in the <111> crystal orientation growth region. A thickness of the anvil surface is 15 micrometers (μm), and a depth of the nitrogen vacancies in the obtained diamond anvil is 15 μm.

Figure 1A:
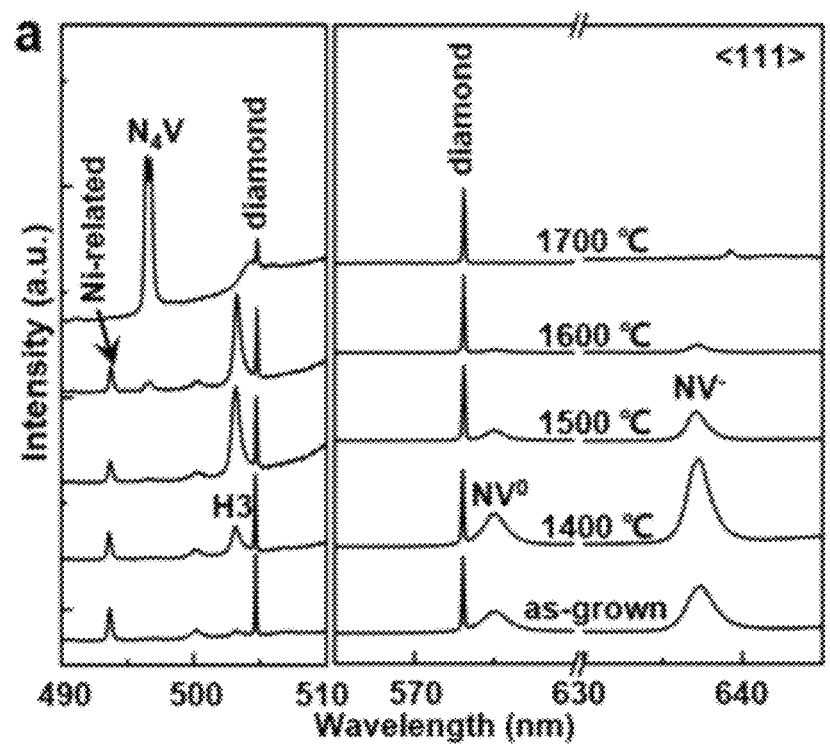
FIG. 1A is a schematic diagram showing a fluorescence spectrum of a <111> crystal orientation growth region before and after annealing at different annealing temperatures according to an embodiment 1 of the disclosure.
Figure 1B:
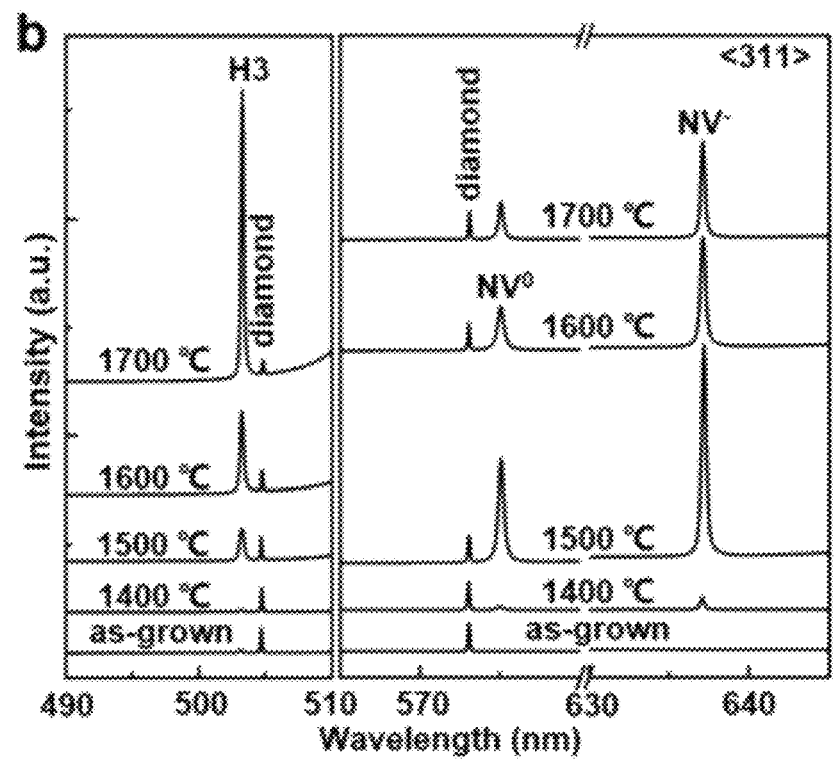
FIG. 1B is a schematic diagram showing a fluorescence spectrum of a <311> crystal orientation growth region before and after annealing at different annealing temperatures according to an embodiment of the disclosure.

As shown in FIG. 1A and FIG. 1B, through a fluorescence mapping analysis: after the annealing, the nitrogen vacancies are presented only in the <311> and <100> crystal orientation growth regions, native nitrogen vacancies in the <111> crystal orientation growth region are disappeared, and the <311> and <100> crystal orientation growth regions do not contain nickel-related defects; and zero-phonon-line (ZPL) FWHM of the nitrogen vacancies generated in the <100> and <311> crystal orientation growth regions is comparable to ZPL FWHM of the nitrogen vacancies in high-purity diamond.

Embodiment 2

A method for preparing a highly coherent diamond anvil includes following steps.

(1) A Synthesis of a Diamond Containing High Quality Nitrogen Vacancies.

An iron-nickel catalyst system is used, a high-purity flaky graphite is used as a carbon source, and Al/Ti is used as a nitrogen remover, a <111> crystallographic plane of the diamond is used as a crystal seed, and a single crystal diamond is synthesized at 5.5 GPa and 1370° C. for 60 h.

(2) Annealing

The HPHT annealing is performed on the single crystal diamond at an annealing pressure of 4.5 GPa and respective annealing temperatures of 1300° C., 1400° C., 1500° C., and 1600° C. for 6 h. Native nitrogen vacancies on the <111> crystal orientation growth region are disappeared under annealing conditions higher than 1400° C., the multiple nitrogen vacancies are generated in the <100> crystal orientation growth region, the <100> crystal orientation growth region does not contain nickel-related curves; and ZPL FWHM of the nitrogen vacancies generated in the <100> crystal orientation growth region is comparable to the ZPL FWHM of the nitrogen vacancies in high-purity diamond.

(3) Cutting of Diamond Anvil

The cutting is performed on the single crystal diamond by placing an anvil surface in the <100> crystal orientation growth region and another main body in the <111> crystal orientation growth region. A thickness of the anvil surface is 15 μm, and a depth of the nitrogen vacancies in the obtained diamond anvil is 15 μm.

Figure 2:
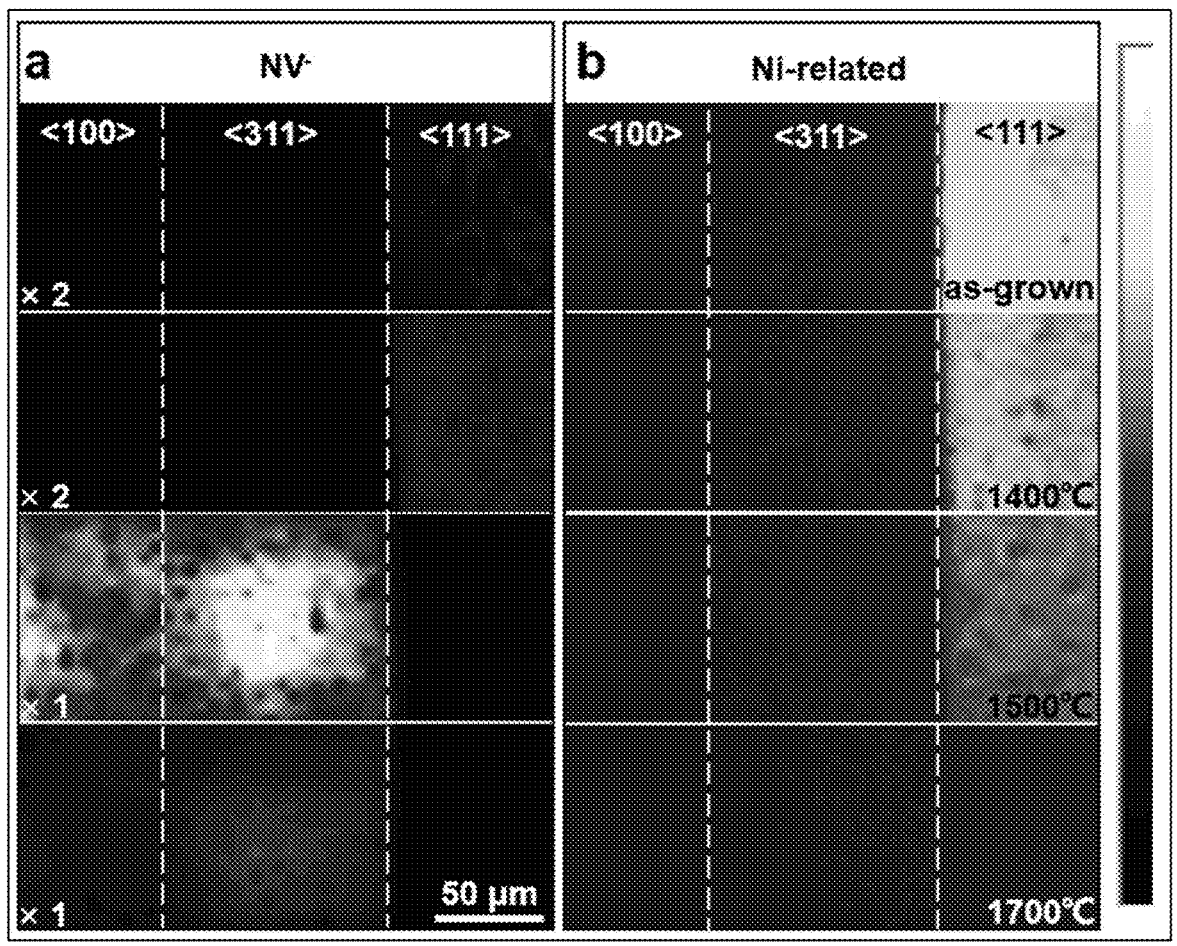
FIG. 2 illustrates a fluorescence mapping diagram of each crystal orientation growth region before and after the annealing according to the embodiment 1 of the disclosure, in which a illustrates a distribution of the nitrogen vacancies in different crystal orientations before and after the annealing; and b illustrates the distribution of annealed nickel-related defects in the different crystal orientations before and after the annealing.
Figure 3A:
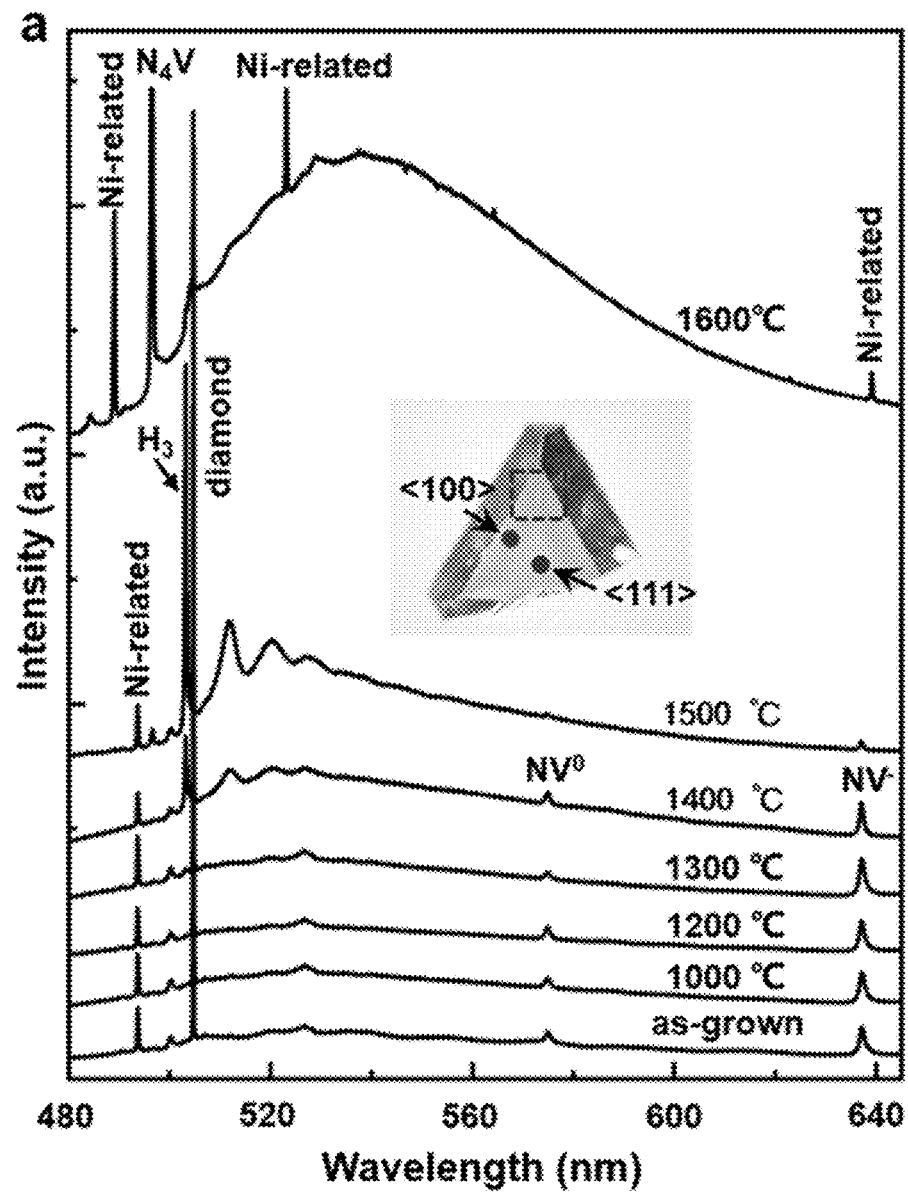
FIG. 3A is a schematic diagram showing a fluorescence spectrum of a <111> crystal orientation growth region before and after annealing at different annealing temperatures.
Figure 3B:
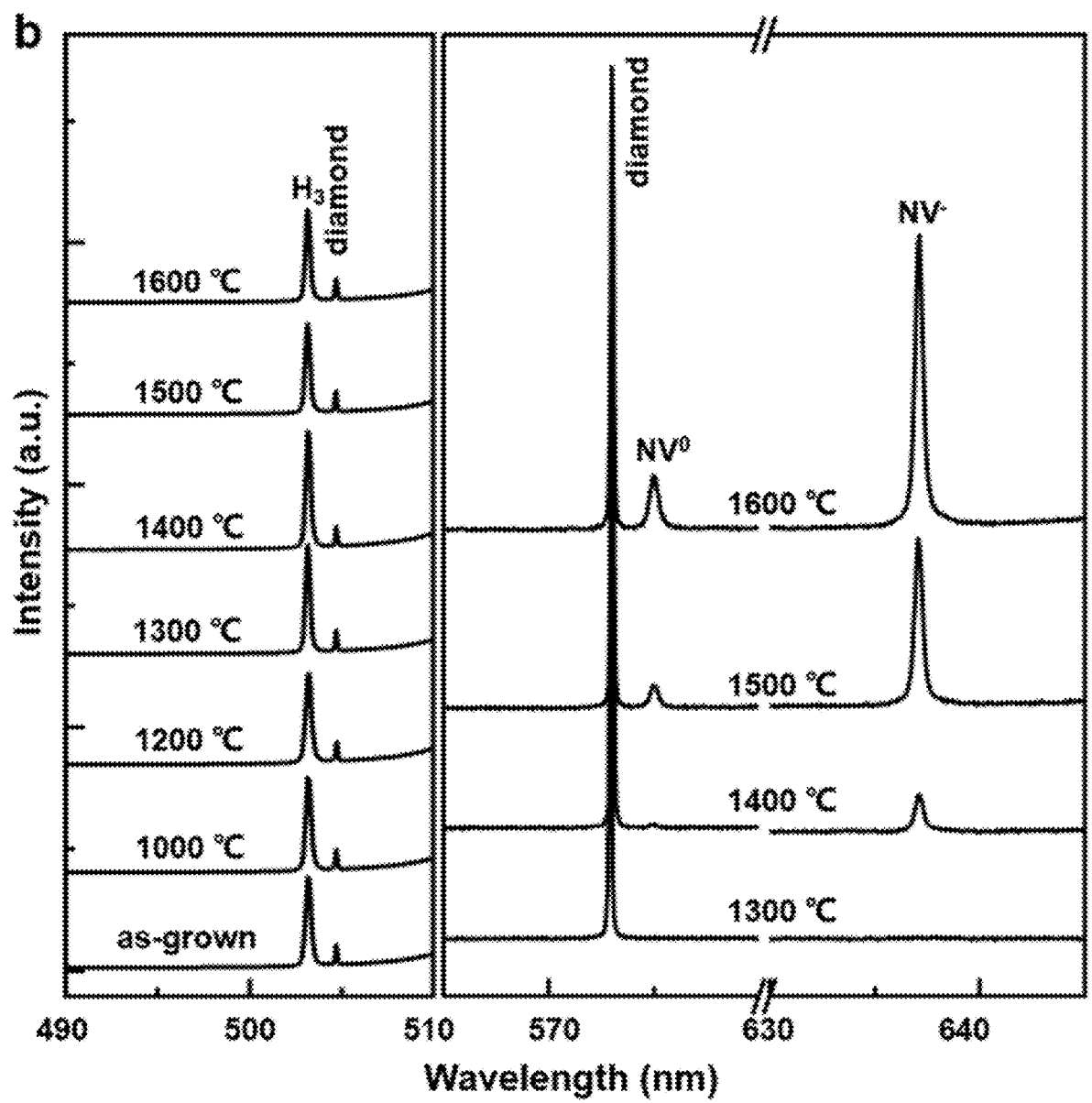
FIG. 3B is a schematic diagram showing a fluorescence spectrum of a <100> crystal orientation growth region before and after annealing at different annealing temperatures.
Figure 4:
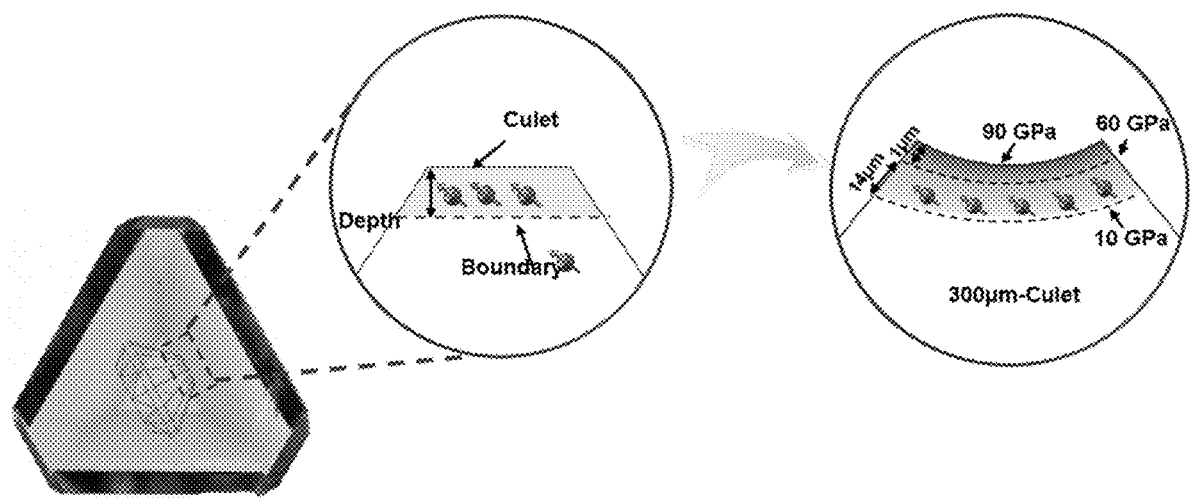
FIG. 4 illustrates a schematic diagram of the diamond anvil cutting.
Figure 5:
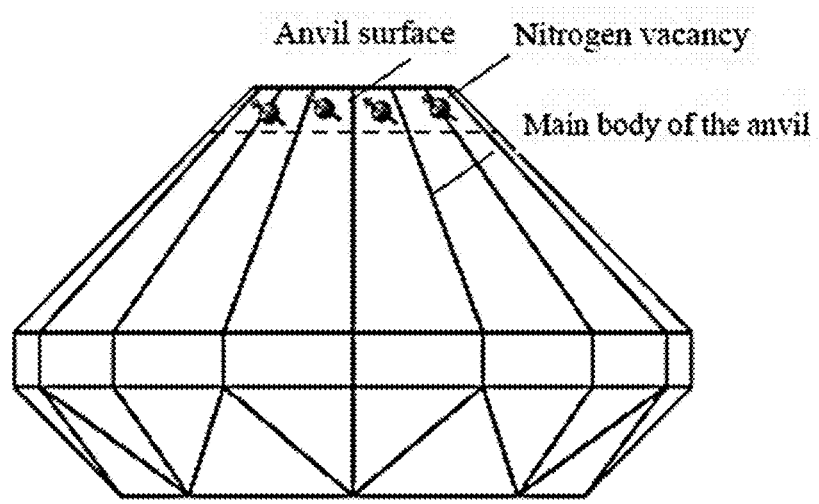
FIG. 5 illustrates a schematic diagram of a diamond anvil.

As shown in FIG. 2, results further demonstrate that after the annealing, the nitrogen vacancies only present in the <100> crystal orientation growth region.

Embodiment 3

A method for preparing a highly coherent diamond anvil includes following steps.

(1) A Synthesis of a Diamond Containing High Quality Nitrogen Vacancies.

An iron-nickel catalyst system is used, a flaky graphite with a purity equal to or greater than 99.9% is used as a carbon source, and Al/Ti is used as a nitrogen remover, a <111> crystallographic plane of the diamond is used as a crystal seed, and a single crystal diamond is synthesized at 6.5 GPa and 1350° C. for 10 h.

(2) Annealing

The HPHT annealing is performed on the single crystal diamond at an annealing pressure of 6.5 GPa and an annealing temperature of 1600° C. for 6 h. Native nitrogen vacancies in the <111> crystal orientation growth region are disappeared, the multiple nitrogen vacancies are generated in the <100> crystal orientation growth region, and the <100> crystal orientation growth region does not contain nickel-related curves; and ZPL FWHM of the nitrogen vacancies generated in the <100> crystal orientation growth region is comparable to the ZPL FWHM of the nitrogen vacancies in high-purity diamond.

(3) Cutting of Diamond Anvil

The cutting is performed on the single crystal diamond by placing an anvil surface in the <100> crystal orientation growth region and another main body in the <111> crystal orientation growth region. A thickness of the anvil surface is 15 μm, and a depth of the nitrogen vacancies in the obtained diamond anvil is 15 μm.

After the annealing, the nitrogen vacancies only present in the <100> crystal orientation growth region.

Embodiment 4

A method for preparing a highly coherent diamond anvil includes following steps.

(1) A Synthesis of a Diamond Containing High Quality Nitrogen Vacancies.

An iron-nickel catalyst system is used, a flaky graphite with a purity of over 99.9% is used as a carbon source, and Al/Ti is used as a nitrogen remover, a <100> crystallographic plane of the diamond is used as a crystal seed, and a single crystal diamond is synthesized at 5 GPa and 1850° C. for 60 h.

(2) Annealing

The HPHT annealing is performed on the single crystal diamond at an annealing pressure of 4.5 GPa, an annealing temperature of 1800° C., and an annealing time of 20 h. There are no nitrogen vacancies on the <111> crystal orientation growth region.

(3) Cutting of Diamond Anvil

The cutting is performed on the single crystal diamond by placing an anvil surface in the <311> crystal orientation growth region and another main body in the <111> crystal orientation growth region. A thickness of the anvil surface is 15 μm, and a depth of the nitrogen vacancies in the obtained diamond anvil is 15 μm.

After the annealing, the nitrogen vacancies only present in the <311> and <100> crystal orientation growth regions, the native nitrogen vacancies in the <111> crystal orientation growth region are disappeared, and the <311> and <100> crystal orientation growth regions do not contain nickel-related defects; and ZPL FWHM of the nitrogen vacancies generated in the <100> and <311> crystal orientation growth regions is comparable to the ZPL FWHM of the nitrogen vacancies in high-purity diamond.

What is claimed is:

1. A method for preparing a diamond anvil, comprising the following steps:
   (1) using an iron-nickel catalyst system, taking a high-purity graphite as a carbon source, taking Al/Ti as a nitrogen remover, and taking a <100> diamond as a crystal seed, synthesizing a single crystal diamond by keeping a temperature of 1460° C. for 60 h at a pressure of 5.5 GPa; wherein a nitrogen content of a <100> crystal orientation growth region of the single crystal diamond is in a range of 20-80 ppm, and a nitrogen content of a <111> crystal orientation growth region of the single crystal diamond is in a range of 200-300 ppm;
   (2) performing a high-pressure-high-temperature (HPHT) annealing on the single crystal diamond at an annealing pressure of 5 GPa for 4 h at temperatures of 1400° C., 1500° C., 1600° C. and 1700° C., respectively; and
   (3) performing cutting on the diamond anvil by placing an anvil surface of the diamond anvil inside a <311> crystal orientation growth region, and placing a main body of the diamond anvil in the <111> crystal orientation growth region; wherein a thickness of the anvil surface is 15 μm, and a depth of the nitrogen vacancies in the obtained diamond anvil is 15 μm.

2. The diamond anvil prepared by the method according to claim 1, wherein the diamond anvil is applied in a quantum sensor.

3. A method for preparing a diamond anvil, comprising:
   (1) a synthesis of a diamond containing high quality nitrogen vacancies, comprising:
   using an iron-nickel catalyst system, taking a high-purity flaky graphite as a carbon source, taking a <111> diamond as a crystal seed, and taking Al/Ti as a nitrogen remover, synthesizing a single crystal diamond by keeping a temperature of 1370° C. for 60 h at a pressure of 5.5 GPa;
   (2) an annealing treatment, comprising:
   performing a HPHT annealing on the single crystal diamond with an annealing pressure of 4.5 Gpa for 6 h at temperatures of 1500° C. and 1600° C., respectively; and
   (3) a cutting of the diamond anvil, comprising:
   placing an anvil surface of the diamond anvil inside a <100> crystal orientation growth region, and placing a main body of the diamond anvil in the <111> crystal orientation growth region; wherein a thickness of the anvil surface is 15 μm, and a depth of the nitrogen vacancies in the obtained diamond anvil is 15 μm.

4. A method for preparing a diamond anvil, comprising:
   (1) a synthesis of a diamond containing high quality nitrogen vacancies, comprising:
   using an iron-nickel catalyst system, taking a flaky graphite with a high-purity greater than 99.9% as a carbon source, taking a <111> diamond as a crystal seed, and taking Al/Ti as a nitrogen remover, synthesizing a single crystal diamond by keeping a temperature of 1350° C. for 10 h at a pressure of 6.5 GPa;
   (2) an annealing treatment, comprising:
   performing a HPHT annealing on the single crystal diamond with an annealing pressure of 6.5 Gpa for 1 h at temperatures of 1600° C.; and
   (3) a cutting of the diamond anvil, comprising:
   placing an anvil surface of the diamond anvil inside a <100> crystal orientation growth region, and placing a main body of the diamond anvil in the <111> crystal orientation growth region; wherein a thickness of the anvil surface is 15 μm, and a depth of the nitrogen vacancies in the obtained diamond anvil is 15 μm.

* * * * *